(12) United States Patent
Noh et al.

(10) Patent No.: US 9,105,345 B2
(45) Date of Patent: Aug. 11, 2015

(54) FERROELECTRIC MEMORY DEVICE AND METHOD FOR MANUFACTURING SAME

(75) Inventors: Tae Won Noh, Seoul (KR); Daesu Lee, Seoul (KR); Jong-Gul Yoon, Suwon-si (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 14/242,000

(22) PCT Filed: Aug. 31, 2012

(86) PCT No.: PCT/KR2012/006966
§ 371 (c)(1),
(2), (4) Date: Feb. 28, 2014

(87) PCT Pub. No.: WO2013/032257
PCT Pub. Date: Mar. 7, 2013

(65) Prior Publication Data
US 2014/0233296 A1     Aug. 21, 2014

(30) Foreign Application Priority Data

Aug. 31, 2011   (KR) .................. 10-2011-0087959

(51) Int. Cl.
*G11C 11/22* (2006.01)
*H01L 27/115* (2006.01)
*H01L 49/02* (2006.01)
*H01L 27/22* (2006.01)

(52) U.S. Cl.
CPC .......... *G11C 11/221* (2013.01); *G11C 11/2275* (2013.01); *H01L 27/11502* (2013.01); *H01L 27/11507* (2013.01); *H01L 27/11509* (2013.01); *H01L 28/55* (2013.01); *G11C 11/22* (2013.01); *H01L 27/228* (2013.01)

(58) Field of Classification Search
CPC . G11C 11/22; G11C 11/223; H01L 27/11502
USPC ......................................... 365/145, 148, 149
See application file for complete search history.

(56) References Cited

U.S. PATENT DOCUMENTS 7,196,924 B2     3/2007   Lai et al.

FOREIGN PATENT DOCUMENTS

| | | |
|---|---|---|
| JP | 05-160360 | 6/1993 |
| JP | 11-040759 | 2/1999 |
| JP | 2000-040378 | 2/2000 |
| KR | 1020010089510 | 10/2001 |
| KR | 1020010101805 | 11/2001 |
| KR | 100543198 | 1/2006 |

OTHER PUBLICATIONS

Korean Office Action issued in corresponding Korean Patent App. No. 10-2011-0087959, mailed Feb. 13, 2013.
International Search Report issued in International App. No. PCT/KR2012/006966, mailed Feb. 8, 2013.

*Primary Examiner* — Connie Yoha
(74) *Attorney, Agent, or Firm* — Greer Burns & Crain Ltd.

(57) ABSTRACT

The present invention relates to a ferroelectric memory device having a multilevel polarization (MLP) state generated due to adjustment of a displacement current and to a method for manufacturing the ferroelectric memory device.

10 Claims, 18 Drawing Sheets

FERROELECTRIC MEMORY DEVICE AND METHOD FOR MANUFACTURING SAME

This application is a U.S. National Phase under 35 U.S.C §371 of International Application No. PCT/KR2012/006966 filed on Aug. 31, 2012, claiming the priority based on Korean Patent Application No. 10-2011-0087959 filed on Aug. 31, 2011, the contents of all of which are incorporated herein by reference in their entirety.

TECHNICAL FIELD

The present application relates to a ferroelectric memory device having a multilevel polarization (MLP) state generated due to adjustment of a displacement current, and to a method for manufacturing the ferroelectric memory device.

BACKGROUND ART

Recently, researches have been conducted to develop a memory device having large capacity and capable of overcoming the limit of refresh required in, e.g., DRAM (Dynamic Random Access Memory) device by using a ferroelectric thin film as a dielectric film of a capacitor.

A ferroelectric random access memory (FeRAM) using such a ferroelectric thin film is a kind of nonvolatile memory device and has advantage that it is capable of maintaining stored information even when power is cut. Besides, FeRAM has further advantages such as high speed accessibility, low power consumption, high strength against impact. Due to these advantages, FeRAM is expected to find applications as a main memory in various electronic devices and equipments having file storage/retrieval function, such as a portable computer, a cellular phone and a game machine, or as a storage medium for storing thereon voice or image.

In a FeRAM device, a memory cell composed of a ferroelectric capacitor and an access transistor stores therein data '1' or '0' having a logical state depending on an electric polarization state of the ferroelectric capacitor. If a voltage is applied to both ends of the ferroelectric capacitor, a ferroelectric material is polarized according to a direction of an electric field. A switching threshold voltage at which the polarization state of the ferroelectric material is changed is referred to as a coercive voltage. To read the data stored in the memory cell, voltages are applied to between two opposite electrodes of the ferroelectric capacitor, and the state of the data stored in the memory cell is detected from a variation in quantity of electric charges excited in a bit line.

As candidates of universal memory, there are known a MRAM (Magnetoresistance Random Access Memory), a PRAM (Phase-change Random Access Memory), a RRAM (Resistive Random Access Memory), etc besides the FeRAM.

Through active researches upon a single universal memory combining speed of SRAM (Static Random Access Memory), non-volatility of flash memory and high capacity of DRAM, there are resulted in various recent memory technologies including FeRAM [M. E. Lines and A. M. Glass, Principles and Applications of Ferroelectrics and Related Materials (Clarendon, Oxford, 1977); J. F. Scott, Ferroelectric Memories (Springer, New York, 2000)], MRAM(Magnetoresistance Random Access Memory), PRAM(Phase-change Random Access Memory), RRAM(Resistive Random Access Memory), etc. FeRAM is basically based on electrically switchable voluntary polarization, and gives high performance as well as high speed [D. S. Rana et al., Adv. Mater. 21, 2881 (2009)] and low power consumption [J. F. Scott, Science 315, 954 (2007)].

In FeRAM technology, however, achieving high storage capacity is difficult and takes high cost. For the reason, FeRAMs having relatively low capacity are put on market only for specific application. To overcome this problem, many researchers have attempted to increase a storage capacity per a unit area by, for example, simplifying structure of a device, reducing the size of the device and diversifying two types of polarization states, which are represented by on and off or 0 and 1, into multiple numbers of intermediate polarization states, thus allowing multilevel bits. Among these various researches, it has been attempted to vary a voltage of an electric pulse applied to the device. Korean Patent No. 10-0543198 describes a ferroelectric memory device having a multi reference voltage generator and attempts to diversity polarization states into various reference voltage levels generated in a negative bit line by on/off optional processing of a first fuse and a second fuse. Further, U.S. Pat. No. 7,196,924 B2 describes a method of adjusting polarization in several stages by applying different voltage to a ferroelectric layer, thus allowing FeRAM to have multiple data values.

However, the aforementioned conventional methods for obtaining multilevel polarization states have attempted to realize multi-levels by varying voltage levels which is applied to ferroelectrics. These conventional methods, however, are highly dependent on characteristics of a ferroelectric material and lack reproducibility and reliability. For example, even if multi-levels having four different polarization states are achieved by adjusting an applied electric strength (amplitude of pulse or width of pulse), the degrees of such polarization states may fluctuate whenever the memory is operated. Thus, actually, the four polarization states may not be guaranteed reliably. In such a case, in an actual device composed of a multiple number of individual ferroelectric memory cells, even if each cell has multilevel polarization states, all the cells may not have constant polarization states. Besides, since reliability of generated polarization states may not be guaranteed each time a single storage cycle taking several tens of nanoseconds is repeated, the device may not be qualified to be used.

DISCLOSURE OF THE INVENTION

Problems to be Solved by the Invention

The present inventors have conducted researches to overcome the limit in achieving high capacity of a conventional ferroelectric memory device and reached the present disclosure by finding out that high capacity of a ferroelectric memory device can be achieved by designing the ferroelectric device to adjust multilevel polarization (MLP) states by controlling a displacement current.

In view of the forgoing, the present disclosure relates to a ferroelectric memory device having a multilevel polarization state generated due to the adjustment of a displacement current, and to a method for manufacturing the ferroelectric memory device.

However, the problems sought to be solved by the present disclosure are not limited to the above description and other problems can be clearly understood by those skilled in the art from the following description.

Means for Solving the Problems

In accordance with one aspect of the present disclosure is provided a ferroelectric memory device comprising a ferroelectric capacitor; and a current limiter including a transistor which is electrically connected to the ferroelectric capacitor, wherein the ferroelectric capacitor includes a multilevel polarization state during a polarization switching process of the ferroelectric capacitor, but may not be limited thereto.

In accordance with another aspect of the present disclosure is provided a manufacturing method for a ferroelectric memory device, comprising forming a ferroelectric capacitor; and forming a current limiter including a transistor which is electrically connected to the ferroelectric capacitor.

Effect of the Invention

In accordance with the present disclosure, by designing the ferroelectric memory device to be capable of adjusting a multilevel polarization states by controlling a displacement current, high capacity of the ferroelectric memory device may be achieved. Thus, it is possible to provide an efficient way to expand a storage capacity density of a ferroelectric memory device such as FeRAM. The ferroelectric memory device of the present disclosure has reliability and reproducibility. Especially, the multilevel polarization states are highly stable and reproducible and have advantage those are not affected by the kind of a ferroelectric material.

DETAILED DESCRIPTION

Figure 1:
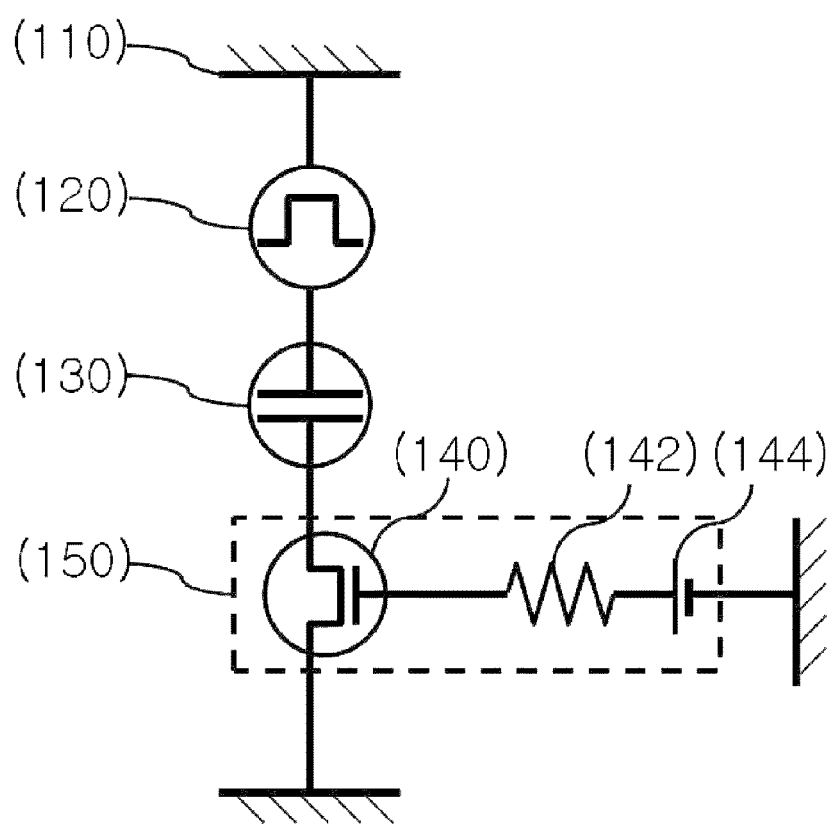
FIG. 1 is a schematic diagram illustrating a ferroelectric memory device capable of adjusting a multilevel polarization state in accordance with an illustrative embodiment of the present disclosure.

Hereinafter, example embodiments will be described in detail so that inventive concept may be readily implemented by those skilled in the art. However, it is to be noted that the present disclosure is not limited to the illustrative embodiments and examples but can be realized in various other ways. In drawings, parts not directly relevant to the description are omitted to enhance the clarity of the drawings, and like reference numerals denote like parts through the whole document.

Through the whole of the present disclosure, the terms "connected to" or "coupled to" are used to designate a connection or coupling of one element to another element and include both a case where an element is "directly connected or coupled to" another element and a case where an element is "electronically connected or coupled to" another element via still another element.

Through the whole of the present disclosure, the term "on" that is used to designate a position of one element with respect to another element includes both a case that the one element is adjacent to the another element and a case that any other element exists between these two elements.

Through the whole of the present disclosure, the term "comprises or includes" and/or "comprising or including" used in the document means that one or more other components, steps, operation and/or existence or addition of elements are not excluded in addition to the described components, steps, operation and/or elements unless context dictates otherwise.

Through the whole of the present disclosure the term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole of the present disclosure, the term "step of" does not mean "step for".

Through the whole document, the term "combinations of" included in Markush type description means mixture or combinations of one or more components, steps, operations and/or elements selected from the group consisting of components, steps, operation and/or elements described in Markush type and thereby means that the disclosure includes one or more components, steps, operations and/or elements selected from the Markush group.

A first aspect of the present disclosure is provided a ferroelectric memory device comprising a ferroelectric capacitor; and a current limiter including a transistor which is electrically connected to the ferroelectric capacitor, wherein the ferroelectric capacitor includes a multilevel polarization state during a polarization switching process of the ferroelectric capacitor.

In accordance with an illustrative embodiment of the present disclosure, the multilevel polarization state can be generated in the ferroelectric capacitor by controlling a displacement current which is inputted to and outputted from the ferroelectric capacitor during the polarization switching process of the ferroelectric capacitor via adjusting an outflow current from the ferroelectric capacitor by the current limiter, but may not be limited thereto.

In accordance with an illustrative embodiment of the present disclosure, the current limiter may includes the transistor which is electrically connected to the ferroelectric capacitor, and a resistor and a DC power supply connected to the transistor, but may not be limited thereto. By limiting and regulating the amount of the outflow current from the ferroelectric capacitor to a certain value by means of adjusting a voltage value of the power supply, a multilevel polarization state can be generated in the ferroelectric capacitor stably and reproducibly.

In accordance with an illustrative embodiment of the present disclosure, the multilevel polarization state having a desired polarization values can be generated in the ferroelectric capacitor by adjusting a speed and an amount of the polarization switching by way of controlling the displacement current, but may not be limited thereto.

In accordance with an illustrative embodiment of the present disclosure, the ferroelectric capacitor may includes a polarization domain array of +Ps to −Ps via as a result of controlling the displacement current, but may not be limited thereto.

In accordance with an illustrative embodiment of the present disclosure, the outflow current from the ferroelectric capacitor may be adjusted by applying a DC bias voltage to a base of the transistor connected to the ferroelectric capacitor, but may not be limited thereto.

In accordance with an illustrative embodiment of the present disclosure, the ferroelectric capacitor may includes a ferroelectric material inserted between a top electrode and a bottom electrode, but may not be limited thereto.

In accordance with an illustrative embodiment of the present disclosure, the ferroelectric material may not be particularly limited and may be appropriately selected from various ferroelectric materials commonly known in the pertinent art by those skilled in the art. By way of non-limiting example, the ferroelectric material may includes a perovskite-based ferroelectric material, but may not be limited thereto. For example, the perovskite-based ferroelectric material may includes one selected from a group consisting of lead zirconium titanate, barium titanate, strontium titanate, lead titanate, lead lanthanum zirconate titanate, lanthanum bismuth titanate, bismuth iron oxide, strontium bismuth tantalite, and combinations thereof, but may not be limited thereto.

In accordance with an illustrative embodiment of the present disclosure, the ferroelectric material may be in the form of an epitaxial thin film, but may not be limited thereto.

In accordance with an illustrative embodiment of the present disclosure, the ferroelectric memory device may be a FeRAM, but may not be limited thereto.

A second aspect of the present disclosure is provided a manufacturing method for a ferroelectric memory device, comprising forming a ferroelectric capacitor; and forming a current limiter including a transistor which is electrically connected to the ferroelectric capacitor.

In accordance with an illustrative embodiment of the present disclosure, the current limiter may includes the transistor which is electrically connected to the ferroelectric capacitor; and a resistor and a DC power supply connected to the transistor, but may not be limited thereto. By limiting and regulating the amount of the outflow current from the ferroelectric capacitor to a certain value by means of adjusting a voltage value of the power supply, a multilevel polarization state can be generated in the ferroelectric capacitor stably and reproducibly.

In accordance with an illustrative embodiment of the present disclosure, the ferroelectric capacitor may be formed to include a ferroelectric material inserted between a top electrode and a bottom electrode, but may not be limited thereto.

In accordance with an illustrative embodiment of the present disclosure, the ferroelectric material may be formed in the form of an epitaxial thin film, but may not be limited thereto.

In accordance with an illustrative embodiment of the present disclosure, a manufacturing method for the epitaxial thin film may not be particularly limited and may be appropriately selected from various methods known in the pertinent art by those skilled in the art. By way of example, the epitaxial thin film may be formed by, but not limited to, pulse laser deposition, but may not be limited thereto.

In accordance with an illustrative embodiment of the present disclosure, the ferroelectric material may not be particularly limited and may be appropriately selected from various ferroelectric materials commonly known in the pertinent art by those skilled in the art. By way of non-limiting example, the ferroelectric material may include a perovskite-based ferroelectric material, but may not be limited thereto. For example, the perovskite-based ferroelectric material may includes one selected from a group consisting of lead zirconium titanate, barium titanate, strontium titanate, lead titanate, lead lanthanum zirconate titanate, lanthanum bismuth titanate, bismuth iron oxide, strontium bismuth tantalite, and combinations thereof, but may not be limited thereto.

In accordance with an illustrative embodiment of the present disclosure, the transistor may includes, but may not be limited to, a bipolar junction transistor, a field effect transistor or a MOS field effect transistor.

Below, an illustrative embodiment of the present disclosure will be elaborated with reference to FIG. 1. However, the example embodiment is not intended to be anyway limiting and various modifications may be made without departing from the technical concept of the present disclosure.

As depicted in FIG. 1, a unit cell of the ferroelectric memory device in accordance with the illustrative embodiment of the present disclosure may includes, but may not be limited to, a ground 110; a pulse generator 120 connected to a top electrode of a capacitor and configured to supply a potential pulse having a certain width and height; a ferroelectric capacitor 130 including the top electrode, a bottom electrode and a ferroelectric material therebetween; a transistor 140 connected to the bottom electrode of the ferroelectric capacitor 130; and a current limiter 150 including a DC power supply 144 and a resistor 142 connected to a base of the transistor 140, but may not be limited thereto.

As shown in FIG. 1, if a voltage is applied by the pulse generator 120, the ferroelectric capacitor 130 is polarized voluntarily, and an electric current is outputted to the outside of the ferroelectric capacitor 130. At this time, the magnitude of the outflow current from the ferroelectric capacitor 130 is limited to a preset level by the current limiter 150 connected to the ferroelectric capacitor 130, so that a ratio of polarization in the ferroelectric capacitor 130 is adjusted. This polarization adjusted as desired or gradually is sensed by a sense amplifier connected to an emitter of the transistor 140, so that a unit cell, which is a minimum memory unit of a non-volatile ferroelectric random access memory having multi-levels, is finally obtained.

In order to implement the ferroelectric memory device having the multilevel polarization state in accordance with the present disclosure, an entire ferroelectrics of the ferroelectric capacitor is configured to have only a +Ps or −Ps polarization state having on or off state. Further, by forming a domain array having +Ps to −Ps polarization state in the ferroelectrics and by controlling a polarization degree ΔP to correspond to a level between a +Ps or a −Ps polarization state, multilevel polarization state may be designed as desired.

Figure 2A:
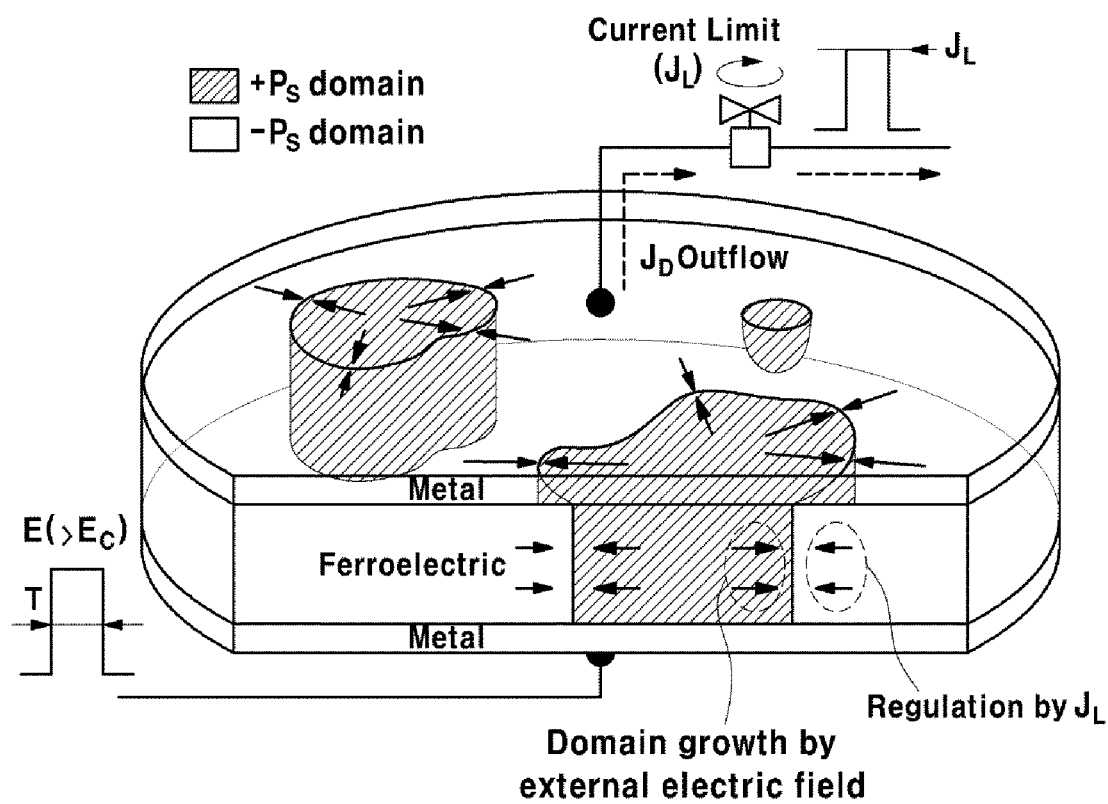
FIG. 2A and FIG. 2B are schematic diagrams illustrating a state where a +Ps domain and a −Ps domain in a ferroelectric layer is adjusted by limiting a current in accordance with an illustrative embodiment of the present disclosure.
Figure 2B:
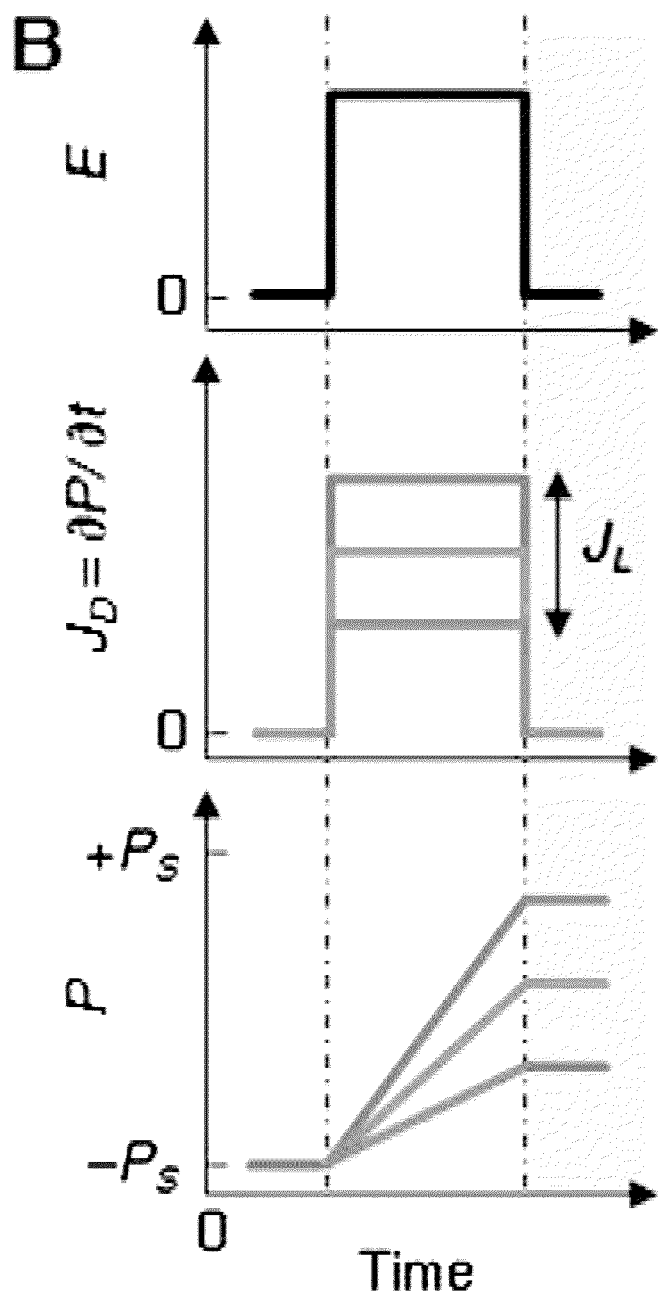

FIG. 2A and FIG. 2B are schematic diagrams illustrating a state where the range of a +Ps domain and a −Ps domain in a ferroelectric layer is adjusted by limiting a displacement current in accordance with the illustrative embodiment of the present disclosure. To elaborate, FIG. 2A illustrates an inventive conception in accordance with the present disclosure, i.e., adjusting a displacement current density $J_D$ in order to design a multilevel polarization (MLP) state with high reliability. FIG. 2B is a graph showing a mechanism of determining a polarization switching ratio by setting an upper limit (i.e., $J_L$) of an outflow current. The amount of the switched polarization is simply determined by $\Delta P = J_L * \tau$. Here, $\tau$ represents a width of an applied electric pulse.

As can be seen from FIG. 2A, shaded portions indicate polarized domains to +Ps, whereas non-shaded portions indicate polarized domains to −Ps. If a voltage pulse is applied to the ferroelectric capacitor, the +Ps domains are about to be expanded at a very fast speed less than a microsecond according to the flow of an outflow current $J_D$ to the outside. However, the expansion of the +Ps domain is restricted by the current limiter. As can be seen from FIG. 2B, the polarization degree ΔP varies depending on the upper limit $J_L$.

A ferroelectric has interior degree of freedom that allows controlling a MLP value as desired. In principal, as shown in FIG. 2A, it may be possible to obtain any intermediate polarization degree ΔP between two saturated values depending on a ratio between the up-polarization (+Ps) and the down-polarization (−Ps). However, due to stochastic and complicated property of polarization switching, it is still challenging to obtain an intermediate polarization state having a desired polarization value [see, for reference, M. Dawber, K. M. Rabe, and J. F. Scott, Reviews of Modern Physics 77, 1083 (2005)].

For the reason, conventionally, application of ferroelectrics has been only limited to the two saturated values and attempt to use a MLP state has been hardly made. Hence, the present inventors have found out very simple technical concept for achieving a ferroelectric MLP state and also found the applicability of this technical conception to an actual system. By realizing the MLP state, it is possible to increase a storage capacity of a ferroelectric memory device such as a FeRAM, etc without requiring an additional technical resolution for minimum wiring width. Therefore, cost per bit can be considerably reduced, and usability as a universal memory may be improved.

Expansion from a bistable ferroelectric polarization state to a MLP state is enabled by controlling an electric current generated while the polarization of the ferroelectric is switched.

The polarization switching process always accompanied by a displacement current density $J_D$. $J_D$ was first introduced in electromagnetic theory of Maxwell in 1861. The displacement current concentration $J_D$ can be defined by a variation of electric polarization and/or an electric field as bellows [see, for example, J. C. Maxwell, Philosophical Transactions of the Royal Society of London 155, 459-512 (1865)].

The present disclosure relates to a ferroelectric memory device having a multilevel polarization (MLP) state generated due to the adjustment of a displacement current and to a method for manufacturing the ferroelectric memory device.

$$J_D = \frac{\partial P}{\partial t} + \varepsilon_0 \frac{\partial E}{\partial t}$$

In the above equation, $\epsilon_0$ represents a dielectric permittivity in vacuum. Introduction of $J_D$ resulted in the completion of classical electromagnetic theories and successful prediction of electromagnetic waves, and $J_D$ became one of the most important physical concepts introduced in any textbooks of electromagnetic. To date, however, it has not been recognized to utilize $J_D$ as a practical tuning parameter for controlling a physical process such as polarization switching.

Hence, the present inventors found out that $J_D$ is capable of performing an important role in recognizing a MLP state in an insulated ferroelectric capacitor. Conventionally, ferroelectric polarization is completely switched from −Ps to +Ps by applying an electrical pulse (higher than a coercive field) to the ferroelectric capacitor. During the polarization switching process, $J_D$ is generated between plates of the capacitor, and, as shown in FIG. 2A, the size of $J_D$ becomes equivalent to a conduction current in the wires leading to and from the capacitor. The essential technical conception of the present inventors for obtaining a MLP state is that a polarization switching ratio can be adjusted by limiting an amount of an outflow current generated from $J_D$. If it is possible to adjust an upper limit of the outflow amount of the electric current to $J_L$, the polarization switching ratio can be exactly determined by $J_L$. Resultantly, as shown in FIG. 2B, the amount of the switched polarization can be simply determined by $J_L * \tau$, and $\tau$ represents a width of an applied electrical pulse. Accordingly, by limiting $J_D$ response, it may be possible to control the speed and the amount of the polarization switching, which in turn enables designing an MLP state having any polarization value.

As stated above, in accordance with the present disclosure design of an MLP state having a desired polarization value and a desired number of polarization states may have a wide range of influence upon application of ferroelectrics.

This is the first demonstration in which a good retention and reproducible multilevel state is satisfied in universal memory candidates such as FeRAM, MRAM, PRAM and RRMA. Although there is a limit in the manufacture of these candidates, the MLP state of the present disclosure may increase a capacity twice or four times even on an existing feature scale. Besides, the MLP state may also be applicable to improving functionality of a wide range of ferroelectric phenomena such as ferroelectric field effect [C. H. Ahn, J.-M. Triscone, and J. Mannhart, Nature 424, 1015 (2003)], ferroelectric tunnel injection [V. Garcia et al., Nature 460, 81 (2009)], ferroelectric photovoltaics [T. Choi, S. Lee, Y. J. Choi, V. Kiryukhin, and S. W. Cheong, Science 324, 63 (2009)] and magneto-electric domain coupling (T. Zhao et al., Nat. Materials 5, 823-829 (2006); S. H. Baek et al., Nat. Materials 9, 309-314 (2010)), which are generally based on polarization and domain array.

Below, examples of the present disclosure will be described in further detail. However, the present disclosure may not be limited thereto.

Examples

Manufacture of Ferroelectric Memory Device 400 nm thick $PbZr_{0.2}Ti_{0.8}O_3$ (PZT) epitaxial thin films sandwiched between a Pt top electrode and a single crystal $SrRuO_3$ bottom electrode was grown on a $SrTiO_3$ substrate by PLD (Personal Laser Deposition). In order to grow a latticematched bottom electrode on the SrTiO$_3$ substrate, an atomically flat and epitaxially strained SrRuO$_3$ film was used.

In order to manufacture a PZT capacitor, a sputtered Pt electrode was patterned in a typical size of 7.5×10$^3$ μm$^2$.

As another example, 400 nm thick BiFeO$_3$(BFO) epitaxial thin films sandwiched between a Pt top electrode and a single crystal SrRuO$_3$ bottom electrode was grown on a SrTiO$_3$ (001) single-crystal substrate by sputtering. The single crystal substrate was cut so as to be deviated from [001] direction by 4°. The bottom electrode included a 10 nm thick epitaxial SrRuO$_3$ layer which is deposited on the SrTiO$_3$ substrate by 90° by off-axis sputtering at 550° C. During the deposition, a total pressure was maintained at 200 mTorr by using a mixture of Ar and O$_2$ gases with at a mixed ratio of 3:2.

Thereafter, a 400 nm thick epitaxial BiFeO$_3$ thin film was grown on top of the SrRuO$_3$ bottom electrode at by fast-rate off-axis sputtering at 690° C. The BiFeO$_3$ sputtering target included an excess 5% Bi$_2$O$_3$ to compensate for the volatile Bi elements. Here, a mixture of Ar and O$_2$ at a mixed ratio of 3:1 was used at a total pressure maintained at 400 mTorr. For the top electrode, a 40 nm thick Pt layer was deposited at a room temperature by on-axis sputtering.

Upon the completion of the deposition, in order to obtain a BiFeO$_3$ capacitor, the Pt layer was patterned by photolithography. The Pt top electrode had a diameter range from 50 to 200 μm.

Analysis of Characteristics of Ferroelectric Memory Device

Figure 3:
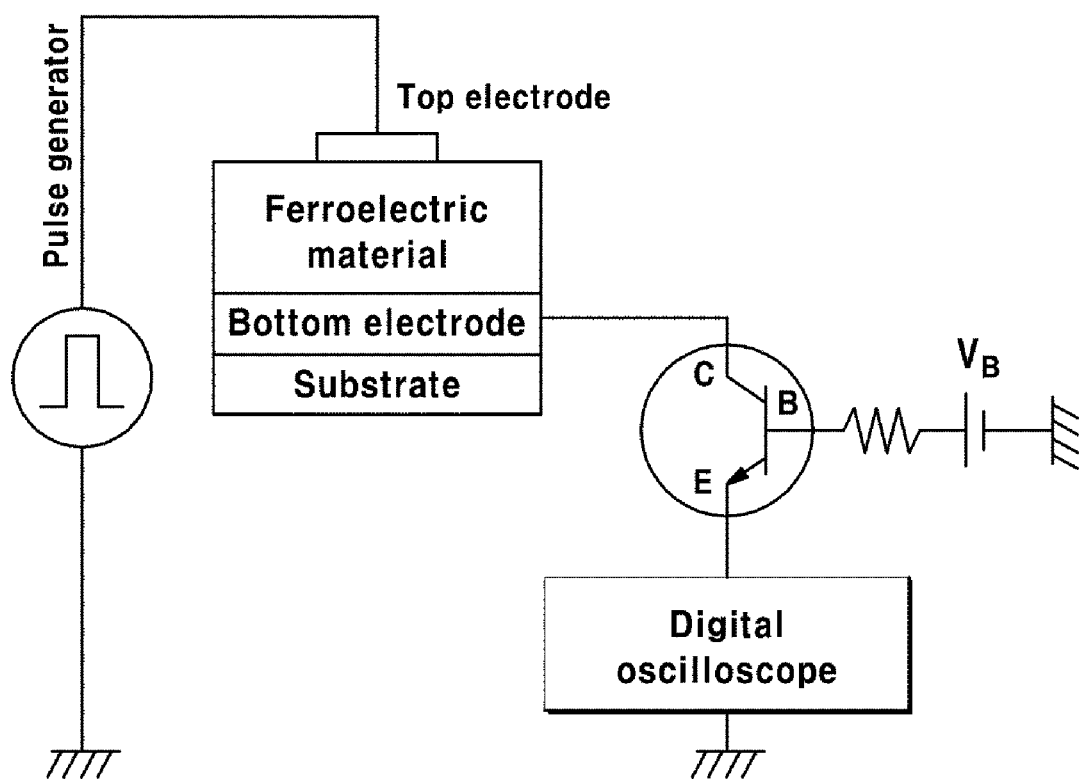
FIG. 3 is a schematic diagram illustrating a configuration of applying an electrical pulse to a ferroelectric capacitor by using a pulse generator to switch polarization by the ferroelectric capacitor in accordance with an example of the present disclosure.

In order to switch polarization of the ferroelectric memory device manufactured as stated above, an electrical pulse was applied to a ferroelectric capacitor by using a pulse generator (FG 300, Yokogawa), as depicted in FIG. 3. By electrically connecting the bottom electrode of the ferroelectric capacitor to a collector C of a transistor, electrically connecting a base B of the transistor to a resistor of 10 kΩ and a DC power supply V$_B$ and electrically connecting an emitter E of the transistor to a digital oscilloscope (DL 7100, Yokogawa), an outflow current amount J$_D$ during polarization switching was measured.

A ferroelectric film in accordance with the present disclosure was found to have very high resistivity (10$^{13}$~10$^{14}$ Ωcm), and, thus, in electrical measurement, influence of leakage current would be negligible. Simultaneously, to obtain the MLP states, J$_D$ during the polarization switching was adjusted by using a self-produced current limiter including a bipolar junction transistor (2N2369, ST) available on the market. A current limit J$_L$ value may be varied by applying a DC bias V$_B$ to the base of the transistor.

Further, ferroelectric characteristics of the films were measured by a TF analyzer (aixACCT).

All the above measurements were performed at a room temperature.

FIG. 4A to FIG. 4E show hysteresis loops of dielectric polarization of a current overflow amount resulted from a displacement current density J$_D$, +Ps or −Ps domains of a ferroelectric layer and tendency of polarization degree ΔP in each of the Pb(Zr,Ti)O$_3$ (lead zirconate titanate, simply referred to as PZT) capacitor and the BiFeO$_3$ (bismuth iron oxide, simply referred to as BFO) capacitor in accordance with the present example.

Figure 4A:
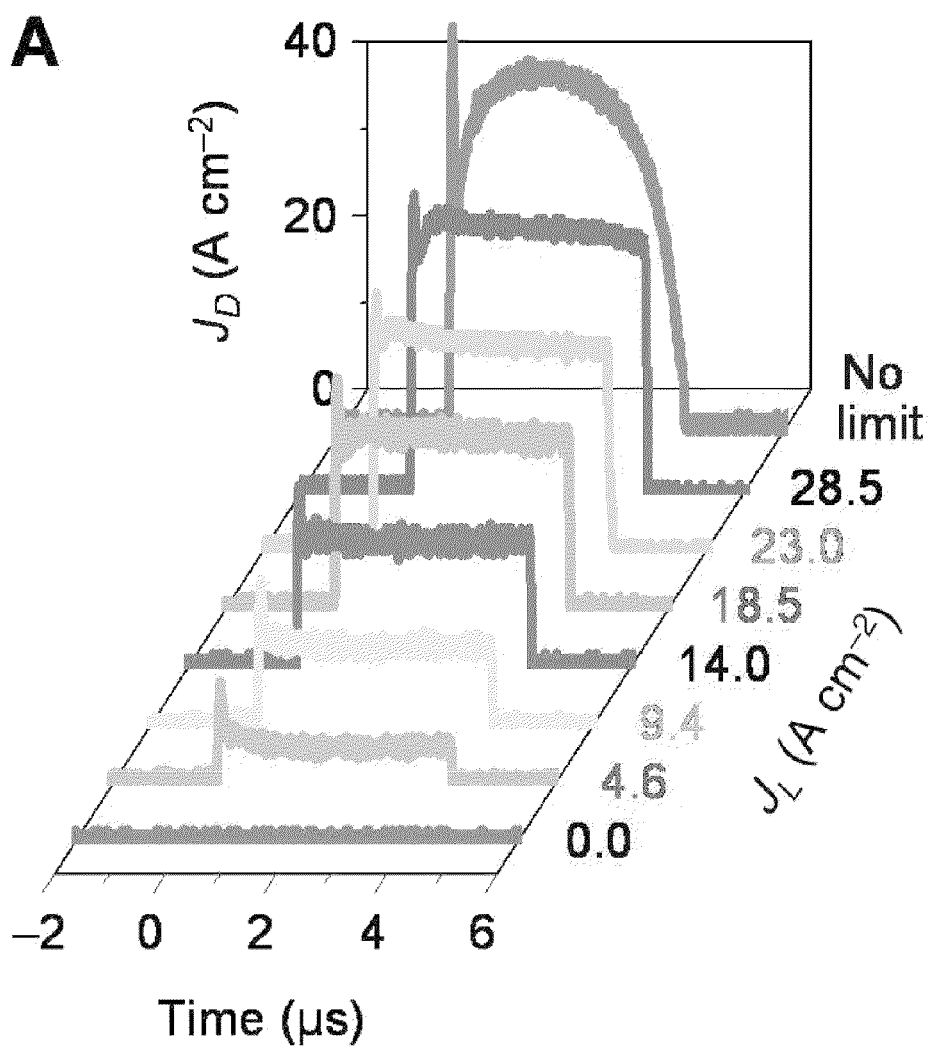
FIG. 4A to FIG. 4E show a current outflow amount resulted from a displacement current density $J_D$, hysteresis loops of dielectric polarization, +Ps or −Ps domains of a ferroelectric layer and tendency of polarization degree $\Delta P$ in each of a PZT capacitor and a BFO capacitor in accordance with an example of the present disclosure.
Figure 4B:
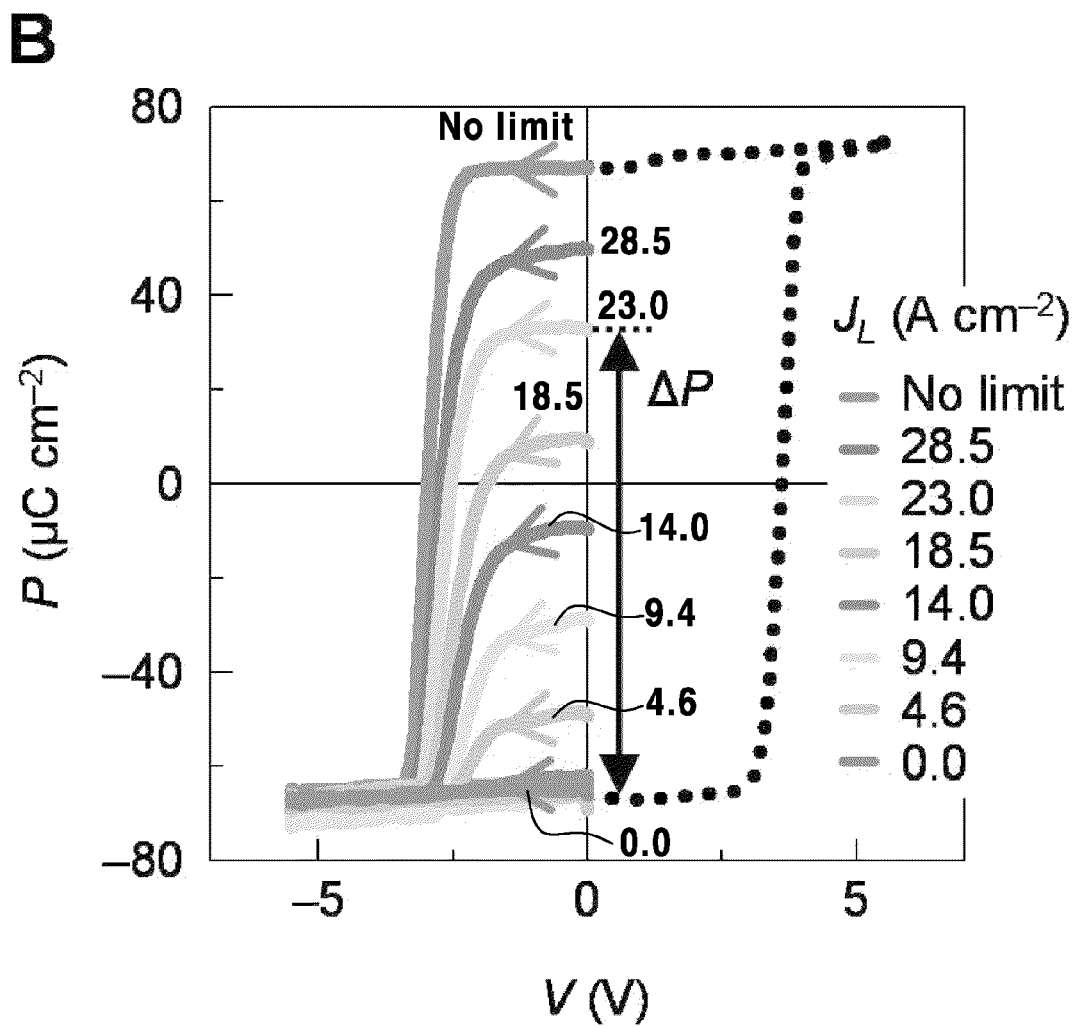
Figure 4C:
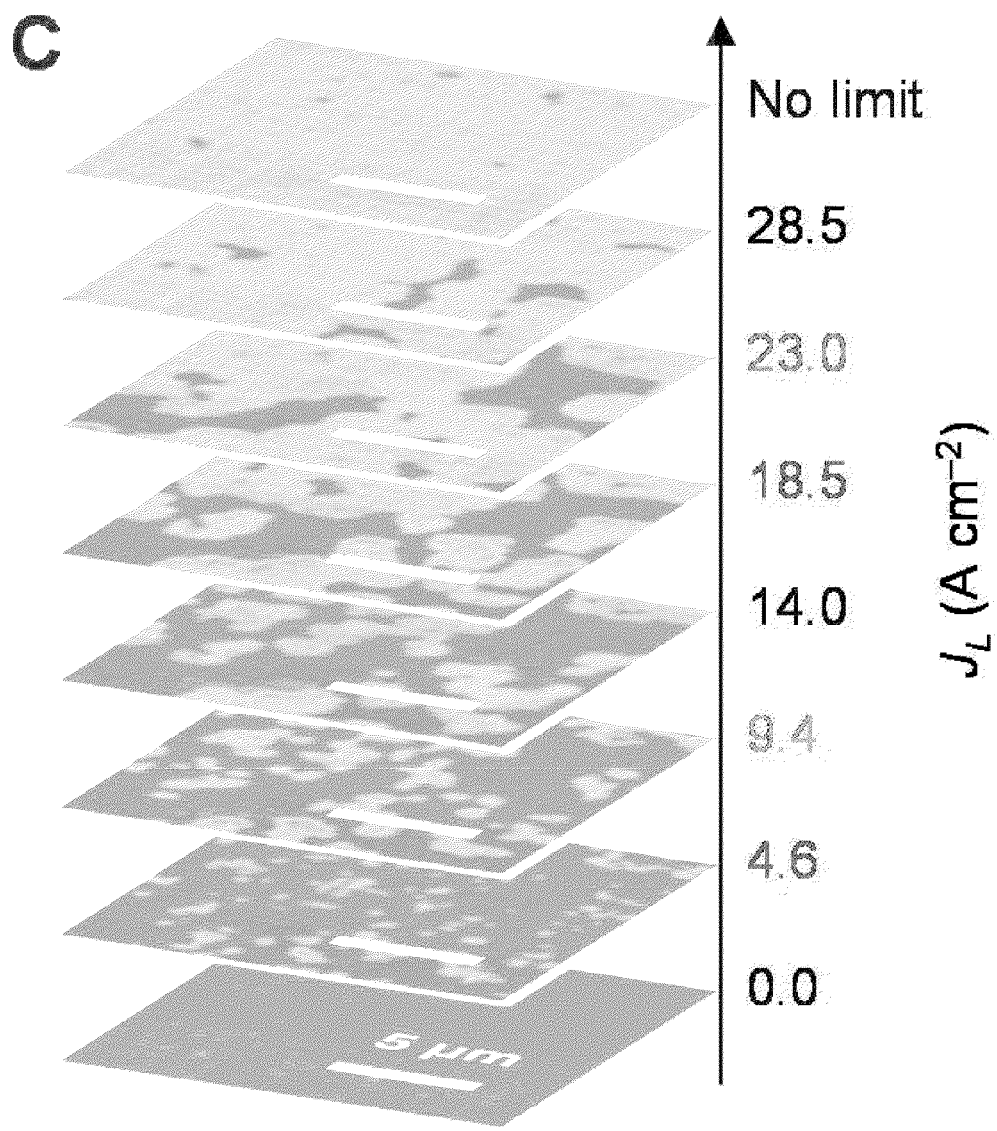
Figure 4D:
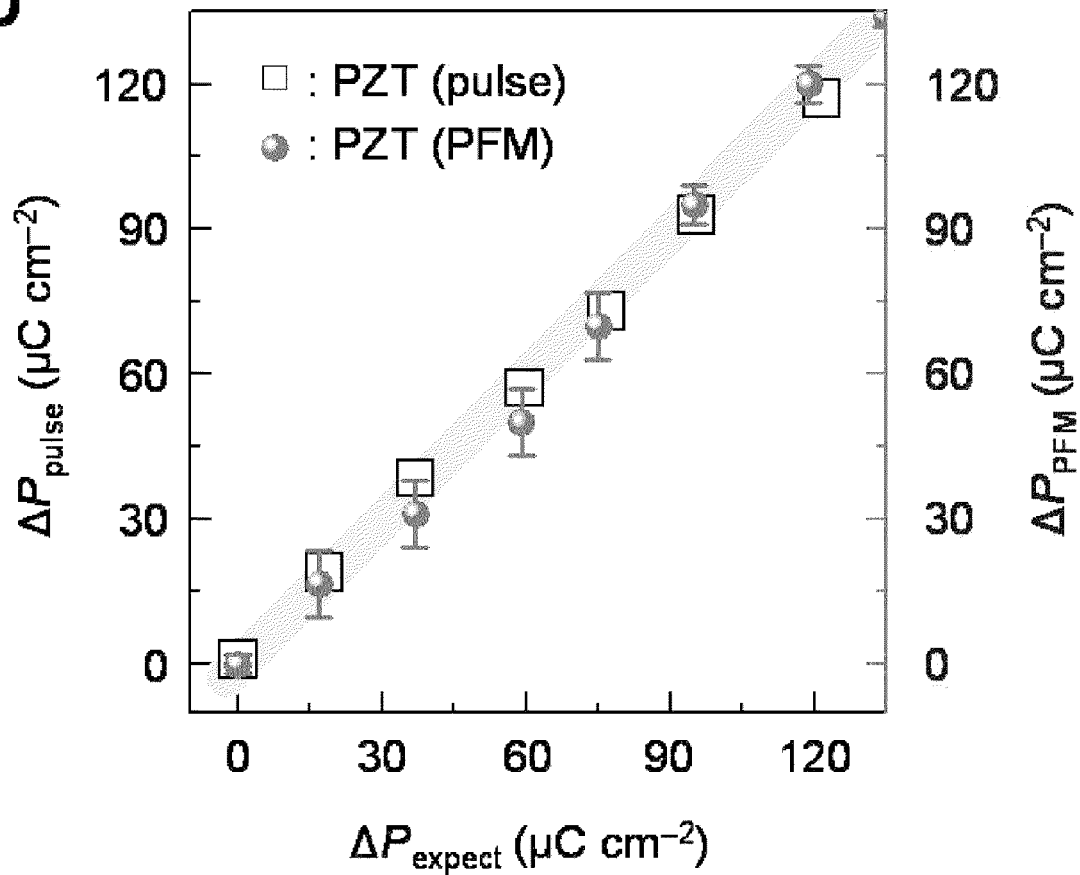
Figure 4E:
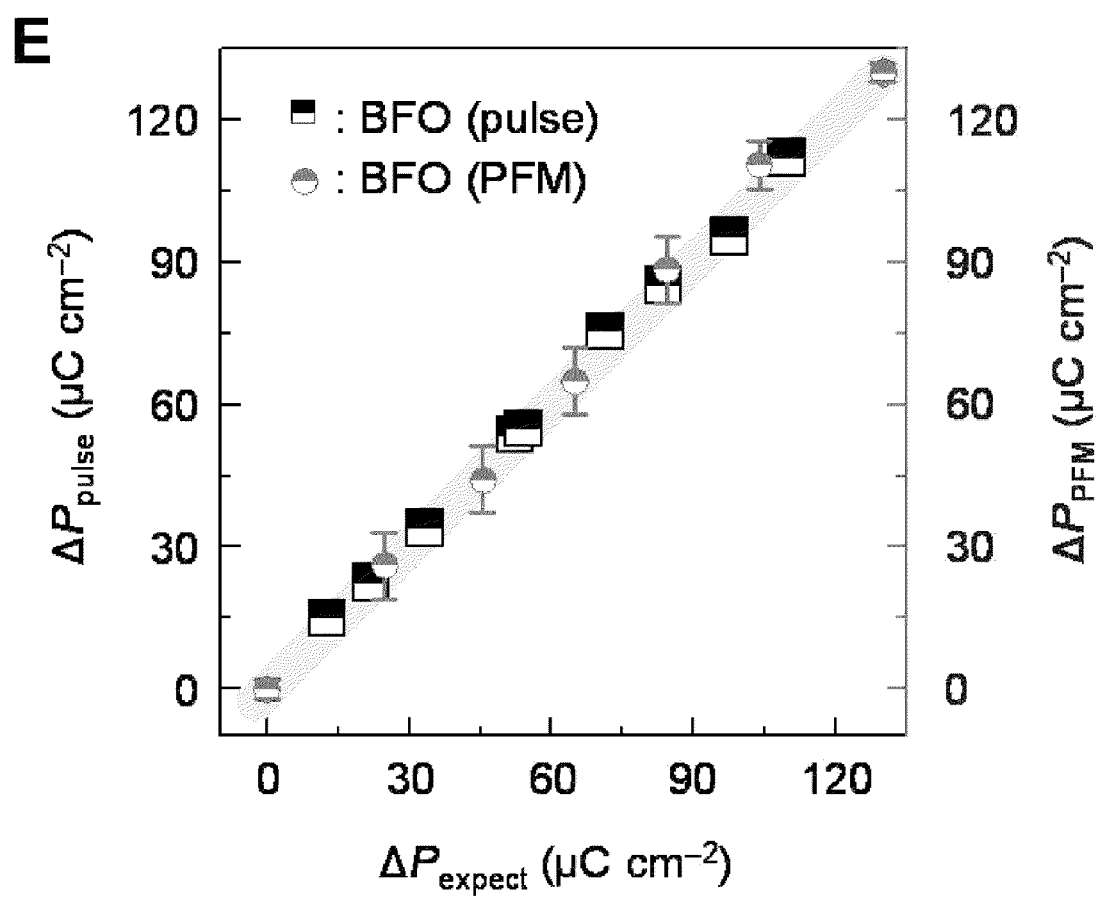

FIG. 4A shows J$_D$ during the polarization switching of the epitaxial thin film as a function of an allotted J$_L$ value. Specifically, FIG. 4A shows J$_D$ values controlled in eight stages when an applied voltage pulse was set to 7V (4.1 μs). FIG. 4B show hysteresis loops that appear in the respective stages and polarization degree ΔP. FIG. 4C shows a polarization domains array of +Ps or −Ps, i.e., images of polarized regions as a result of measuring a surface of the PZT capacitor with a piezoelectric force microscope (PEM). FIG. 4D is a graph showing good agreement of a polarization degree ΔP$_{pulse}$ measured from a pulse of the capacitor, which consists of the PZT ferroelectrics and a polarization degree ΔP$_{PEM}$ measured by PEM with an expected polarization degree ΔP$_{expect}$ and a linear tendency thereof. FIG. 4E is a graph showing good agreement of a polarization degree ΔP$_{pulse}$ measured from a pulse of the capacitor, which consists of the BFO ferroelectric and a polarization degree ΔP$_{PEM}$ measured by PEM with an expected polarization degree ΔP$_{expect}$ and a linear tendency thereof.

In the present example, by using a PZT dielectric film, the capacitor was polarized to have the −Ps state at an initially, and, then, a voltage of +7 V (>coercive voltage) was applied. During the polarization switching, the electric current limit was set to J$_L$, and by measuring a response of outflow of electric current, J$_D$ was determined. As shown in FIG. 4A, no response from J$_D$ was observed when outflow of any electric current was not permitted (i.e., J$_L$=0). When there was no limit in the outflow of the electric current, a conventional non-linear response of J$_D$ was observed, which was resulted from full switching into a +Ps state. J$_L$ from 4.6 to 28.5 Acm$^{-2}$ and J$_D$ response showed, as can be expected in FIG. 2B, a rectangular-like behavior. A spike-like feature of the J$_D$ data near τ=0 is resulted from contribution of e$_0$(∂E/∂τ) in J$_D$, which is not related to polarization switching and thus can be negligible. From FIG. 4A, it was found out that the height of the rectangular-shaped J$_D$ response almost coincides with J$_L$ values, which implies that a polarization switching ratio can be determined by J$_L$ value. Further, due to a constant ratio of the polarization change, an amount of switched polarization of an MLP state can be simply expected by the equation of ΔP$_{expect}$=J$_L$*τ.

By showing that the actually switched polarization degree ΔP is the same as the expected polarization degree ΔP$_{expect}$, it was proved that controllable switching for obtaining a MLP state can be realized. To measure the polarization degree ΔP, pulse measurement [See, for reference, H. N. Lee et al., Phys. Rev. Lett. 98, 217602 (2007)] was performed.

As can be seen from FIG. 4B, the pulse measurement provided P-V magnetic hysteresis loop in a negative V domain. A remnant polarization value at V=0 determines the polarization degree ΔP for achieving an MLP state. Even if the same voltage pulse (e.g., +7 V) was applied for polarization switching, the measured ΔP value was found to increase systematically with the increase of J$_L$. Further, as depicted in FIG. 4D, the ΔP value was found to be equal to the ΔP$_{expect}$ value within a measurement error in the present disclosure. This result implies that J$_D$ is actually a critical control parameter for tuning the polarization state in ferroelectrics and other related physical properties, such as domain array.

Figure 5:
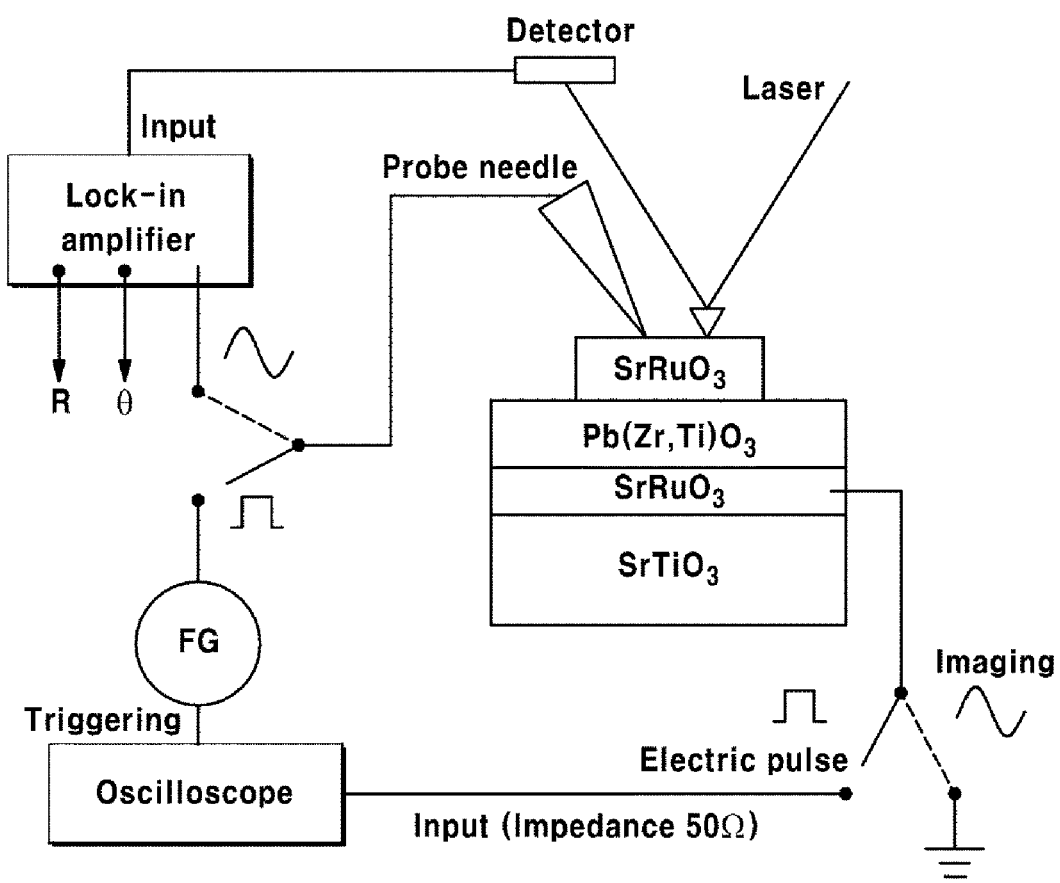
FIG. 5 is a schematic diagram illustrating a piezoelectric force microscope (PEM) system setup configured to investigate +Ps and −Ps domain patterns of ferroelectric thin films in accordance with an example or a comparative example.

In the present example, by using the piezoelectric force microscopy (PEM), correlation between systematic generation of ΔP and ferroelectric domain array in PZT film was visualized (see FIG. 5). FIG. 5 is a diagram showing a PEM system setup for investigating +Ps or −Ps domain patterns of ferroelectric thin films in accordance with an examples of the present disclosure and/or comparative examples. In the measurement system of FIG. 5, an amplitude R and a phase θ of a piezoelectric signal was measured by using an lock-in amplifier (SR830, Stanford Research Systems). ΔP could be measured from the above domain image. In the above setup, the amount of a switched polarization domain near a particular position needs to be proportionate to R cos θ, because R cos θ ∝ d$_{33}$=2Q$_{33}$εε$_0$P (here, d$_{33}$ is a piezoelectric constant; Q$_{33}$, an electrostriction coefficient; ε, a dielectric constant of a ferroelectric layer). ΔP was measured by combining R cos θ signals over the scanned domain and appropriately normalizing the combination result.

The measurement result, FIG. 4E clearly shows that a domain pattern develops systematically with increase of $J_L$. ΔP can be expected from the above domain image and, also, by combining the piezoelectric signals over the scanned domain and normalizing the combination result. FIG. 4D shows that the ΔP value expected from the PEM image coincides with the $ΔP_{expect}$ value, which proves that polarization switching and domain array can be accurately controlled by using $J_D$.

Figure 6:
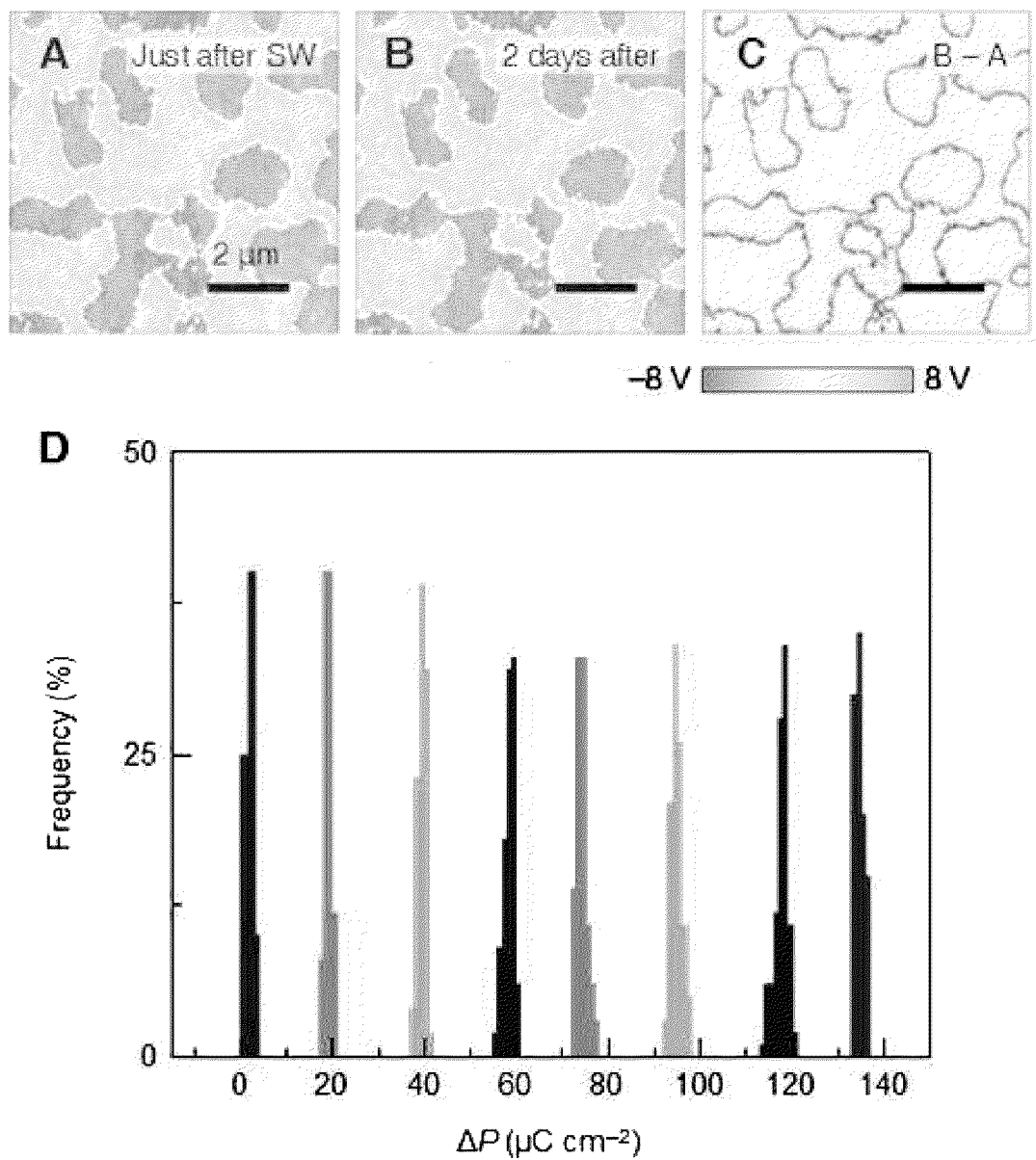
FIG. 6A to FIG. 6D are images obtained by the PEM and showing a variation in polarization domains and a distribution of polarization degree $\Delta P$ in a ferroelectric thin film immediately after and two days after polarization switching is performed, and provide a frequency distribution of $\Delta P$ values measured for respective polarization states in accordance with an example of the present disclosure.

FIG. 6A to FIG. 6D are images showing a variation in polarization domains and a distribution of polarization degree ΔP in a ferroelectric thin film immediately after or two days after polarization switching is performed in the present example. FIG. 6A shows a domain array for the ferroelectrics immediately after the polarization switching, whereas FIG. 6B shows a domain array two days after the polarization switching. FIG. 6C shows a difference between the two domain states, which is obtained by subtracting a piezoelectric signal of FIG. 6B from FIG. 6A. Only a very small amount of relaxation is found to occur on the ferroelectric domain, which implies that non-volatility of the domain array is maintained. FIG. 6D is a plot of ΔP values measured for respective polarization states in relation to frequency and was obtained by 100 times of pulse measurements. Regardless of as many times of writing/reading experiments as 100 times, ΔP value measured for the respective multilevel polarization states have a standard deviation smaller than 2.0 μCcm$^{-2}$ and exhibit a very narrow distribution.

Two important issues need to be considered for the reliability of the MLP state. First, all intermediate polarization states need to be very stable and maintained its value for a long time without relaxation. In principal, a multi-domain state should be stable because depolarization field for the multi-domain state is smaller than that for a single domain state. To deal with such a relaxation issue, time-dependent generation of very microscopic scale domain structure having a spatial resolution of 50 nm was observed by performing PEM measurements immediately after switching (FIG. 6A) and two days after switching (FIG. 6B) was performed. FIG. 6C shows that a negligibly small amount of relaxation occurs two days after, even if microscopic scale. This result implies high stability of the MLP state and the robust nature of the multi-domain structure of the MLP state.

The second important issue is reproducibility of all multilevel polarization states. To elaborate, the respective states need to be well separated into given polarization values during the repeated writing/reading processes. To deal with this issue, a writing process cycling test was performed. By adjusting $J_D$, eight MLP states were wrote, and, then, as shown in FIG. 4B, ΔP values were measured through pulse measurement of magnetic hysteresis.

The writing and pulse measurement of ΔP were repeated 100 times for each MLP state. FIG. 6D shows that ΔP values measured for the respective states have a standard deviation smaller than 2.0 μCcm$^{-2}$ and exhibit a very narrow distribution.

Through such accurate control, all of the states are highly reproducible, have a sufficiently large margin of 15 μC cm$^{-2}$ to avoid a reading error, and are easily separable from neighboring states. Thus, based on experiments of retention and reproducibility, it can be concluded that adopting the technical conception of using $J_D$ in accordance with the present disclosure may be a critical pathway to achieve the MLP state for applicability in the field of ferroelectric-based electromagnetic engineering.

Importantly, the realization of the MLP state using the technical conception of the present disclosure does not greatly depend on a complicated characteristic of polarization switching process. In general, polarization switching may relay on material system and be affected by complicated factors of ferroelectric materials. A conventional way to produce an intermediate polarization between +Ps and −Ps has been controlling strength (e.g., amplitude and/or pulse width) of an applied electrical pulse. However, such a conventional method could not enable highly reliable application of MLP, which results from that an inevitable change in a defect distribution of material and/or fatigue should cause a great change in ΔP although the applied voltage pulse has the same strength. Meanwhile, in accordance with the present disclosure, an output of $J_D$ is directly determined and does not rely on a material system, and a general structure to obtain any a polarization value between +Ps and −Ps with high reproducibility is provided. In this aspect, the technical conception of the present disclosure is totally different from conventional techniques.

In the present example, universality (generality) of the technical conception of the present disclosure using another ferroelectric material, the BFO (BiFeO$_3$) epitaxial thin film, was also proved. A polarization switching path of BFO and a resulted domain array are very different from those of PZT, which is resulted from ferroelectric contribution in BFO. Regardless of this difference, however, in case of the BFO thin film, measured ΔP values and expected ΔP values are found a good agreement in all MLP states, as in the case of the PZT thin film (FIG. 4E). This result confirms the universality of the technical conception of the present disclosure, which does not depend on a certain material and a polarization switching characteristic.

Figure 7:
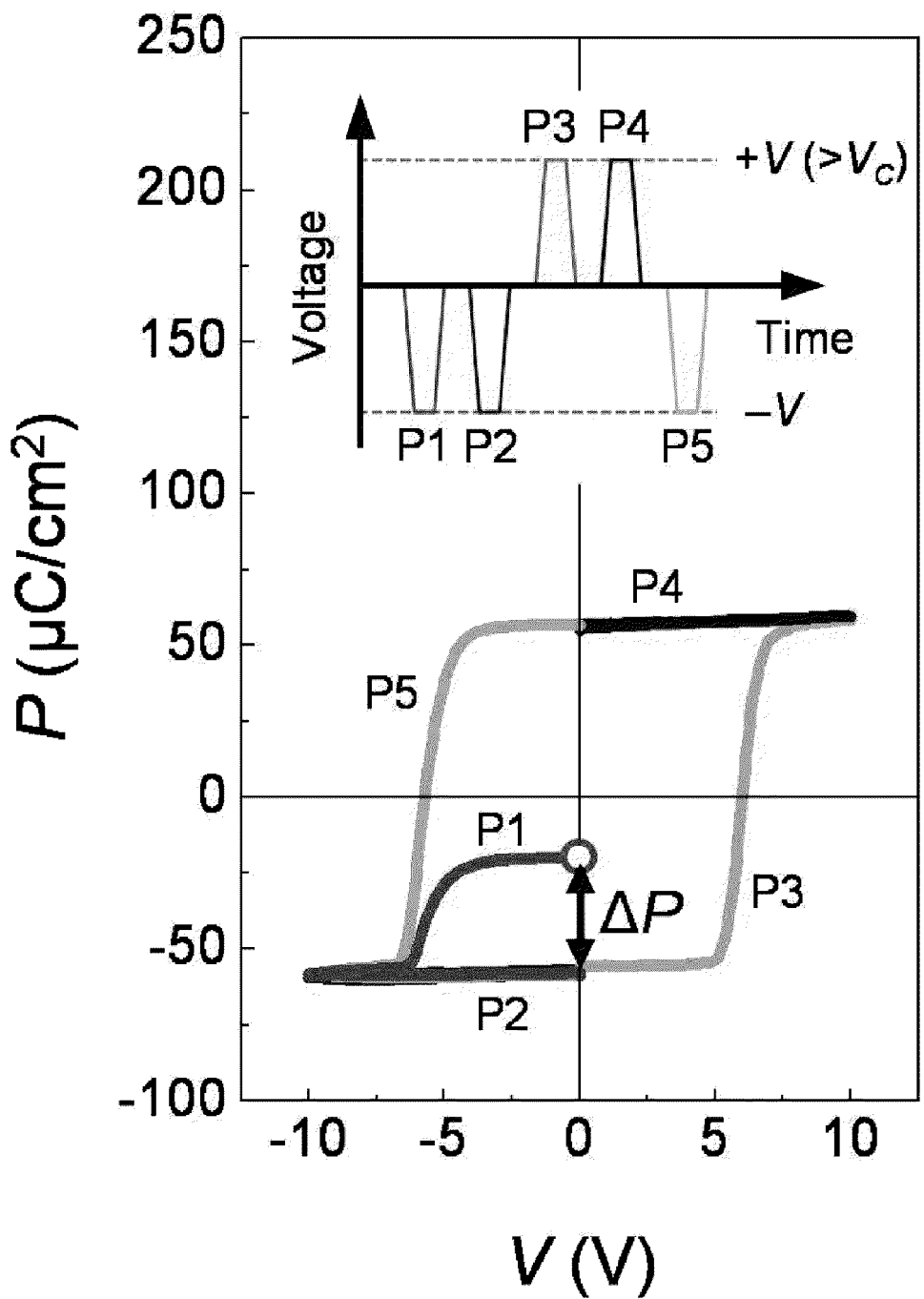
FIG. 7 is a graph showing pulse measurement of switched polarization of the ferroelectric thin film in accordance with an example of the present disclosure.

FIG. 7 is a graph showing pulse measurement of switched polarization of the ferroelectric thin film in accordance with the present example. For the pulse measurement, a TF analyzer was used. A trapezoid-shaped pulse (higher than a coercive force) having a reading-pulse time of 2 ms and a pulse delay of 0.5 s was applied. Through this pulse measurement, switched polarization values ΔP of multilevel polarization states were measured. FIG. 7 is a graph showing hysteresis loops of dielectric polarization and polarization degrees for pulses P1 to P5.

Figure 8A:
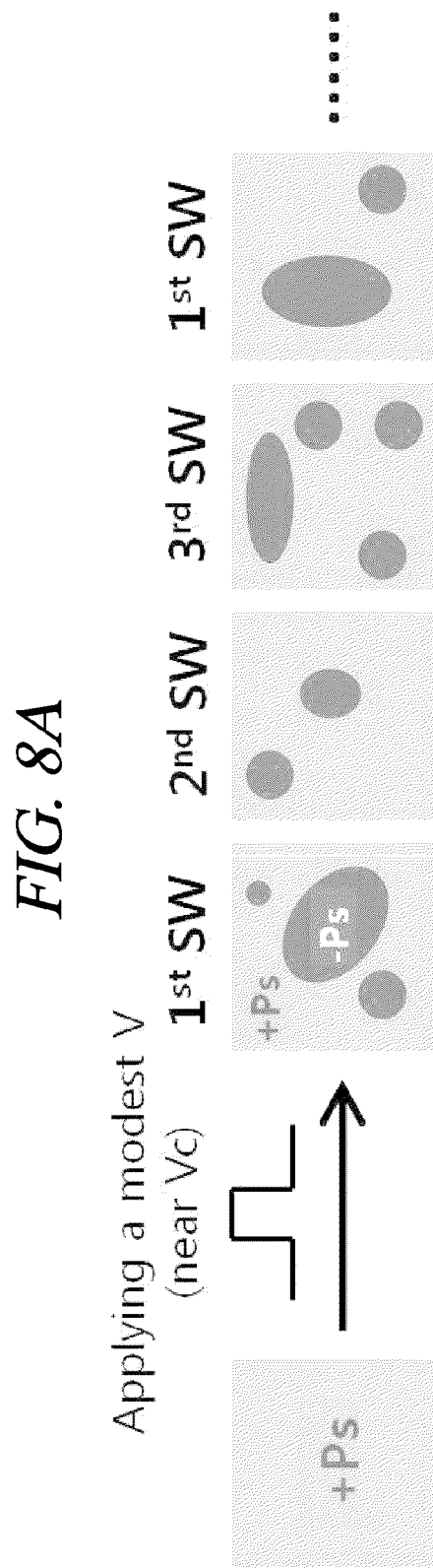
FIG. 8A to FIG. 8C are diagrams showing +Ps or −Ps domain patterns, hysteresis loops of dielectric polarization and frequency distribution of polarization degree $\Delta P$ of a ferroelectric thin film formed by a conventional method of creating an intermediate polarization state.
Figure 8B:
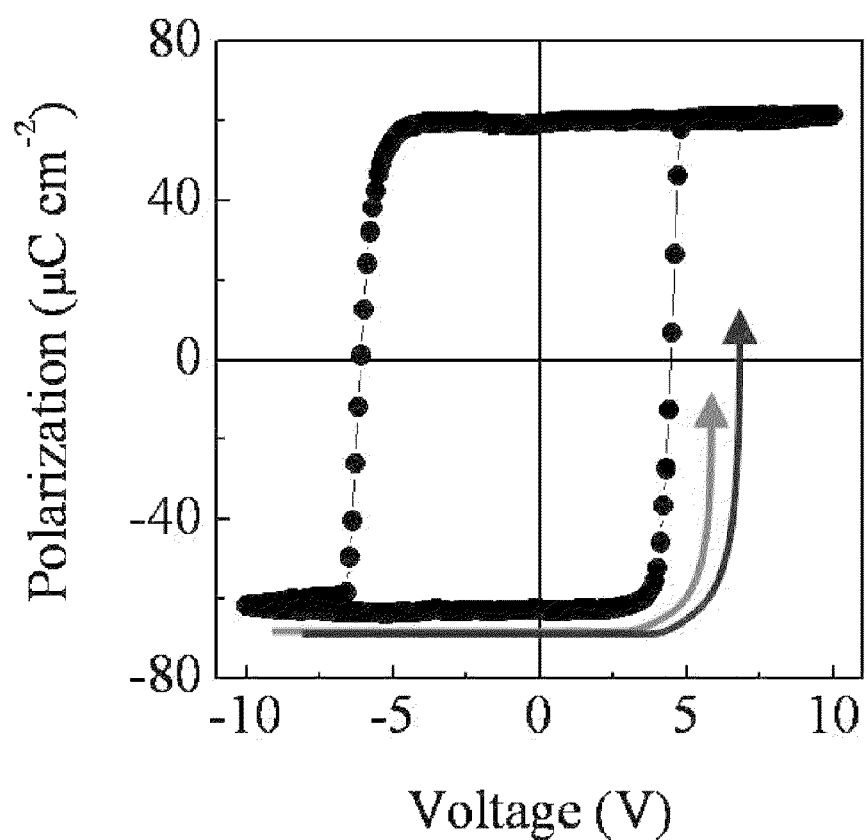
Figure 8C:
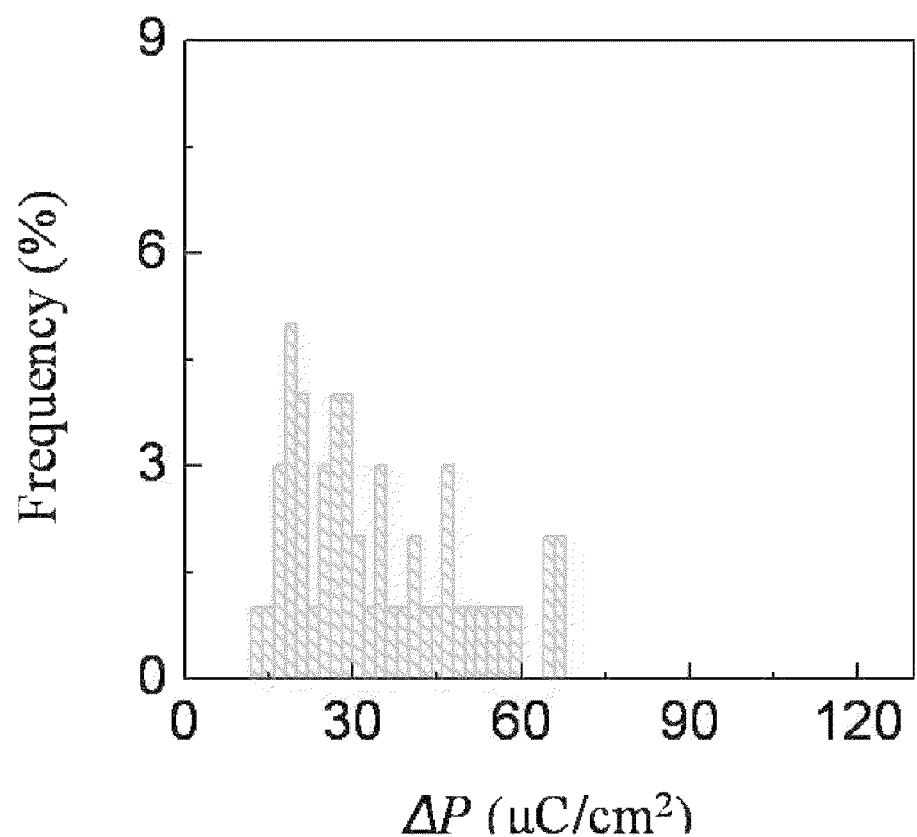

FIG. 8A to FIG. 8C are diagrams showing +Ps or −Ps domain patterns, hysteresis loops of dielectric polarization and distribution of polarization degree ΔP of a ferroelectric thin film formed by a conventional method of creating an intermediate polarization state. FIG. 8A is a schematic diagram showing variations of shape, position and amount of respective domains. As can be seen from this diagram, a domain array of polarization formed by varying the height of an applied voltage is differed whenever writing/reading experiments are repeated. FIG. 8B shows a hysterias loop in which an induced intermediate dielectric polarization value changes frequently even though the same voltage of +4 V is applied. FIG. 8C indicates that, even through the same voltage of +4 V is applied, a distribution range of the polarization degree ΔP generated thereby is very wide. That is, reliability of the multilevel ferroelectric polarization state achieved by the conventional method is not high enough to be applied to an actual device.

Figure 9A:
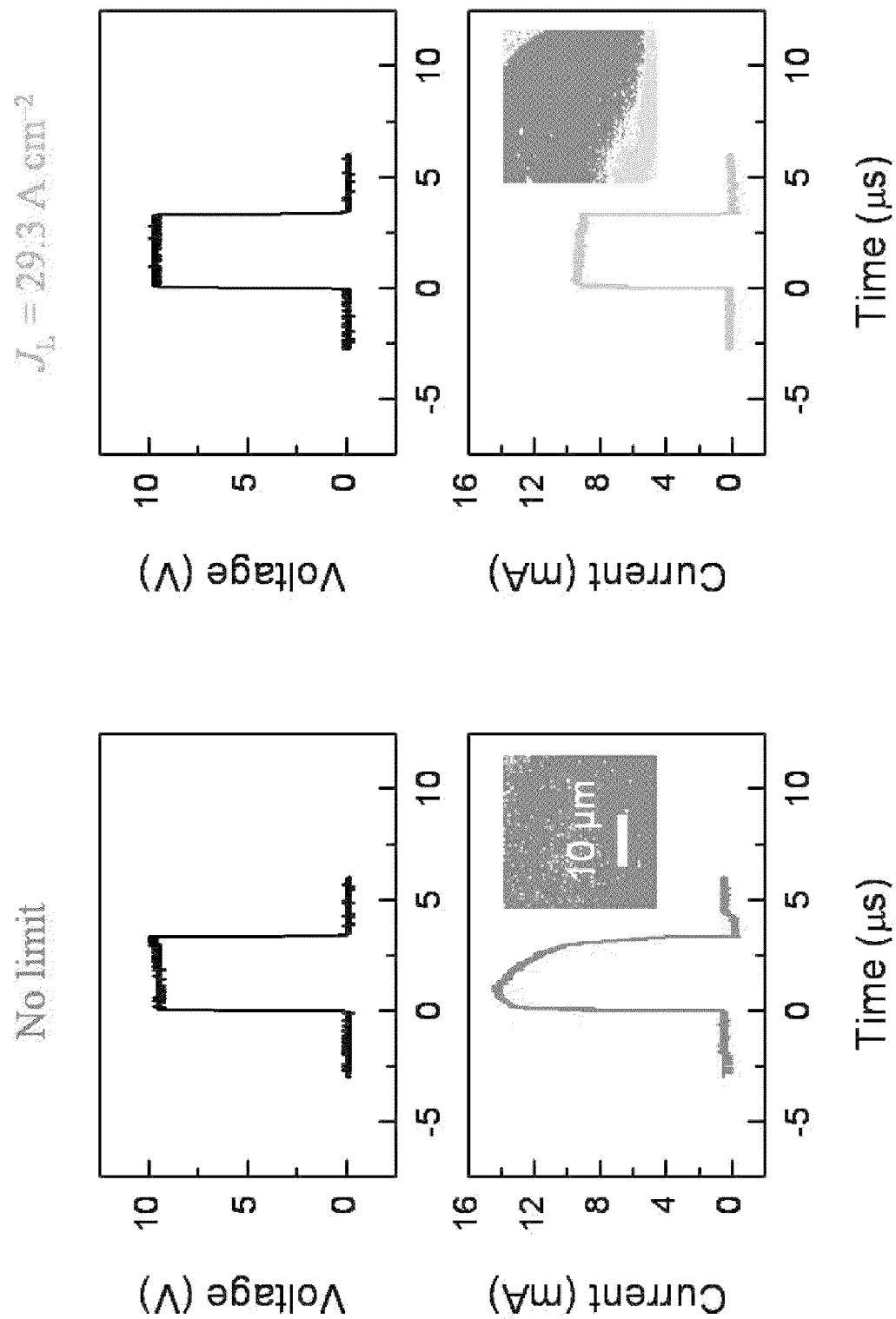
FIG. 9A to FIG. 9C show +Ps or −Ps domain patterns of a BFO ferroelectric thin film and pulse measurement values of switched dielectric polarization in relation to current limit value in accordance with an example of the present disclosure.
Figure 9B:
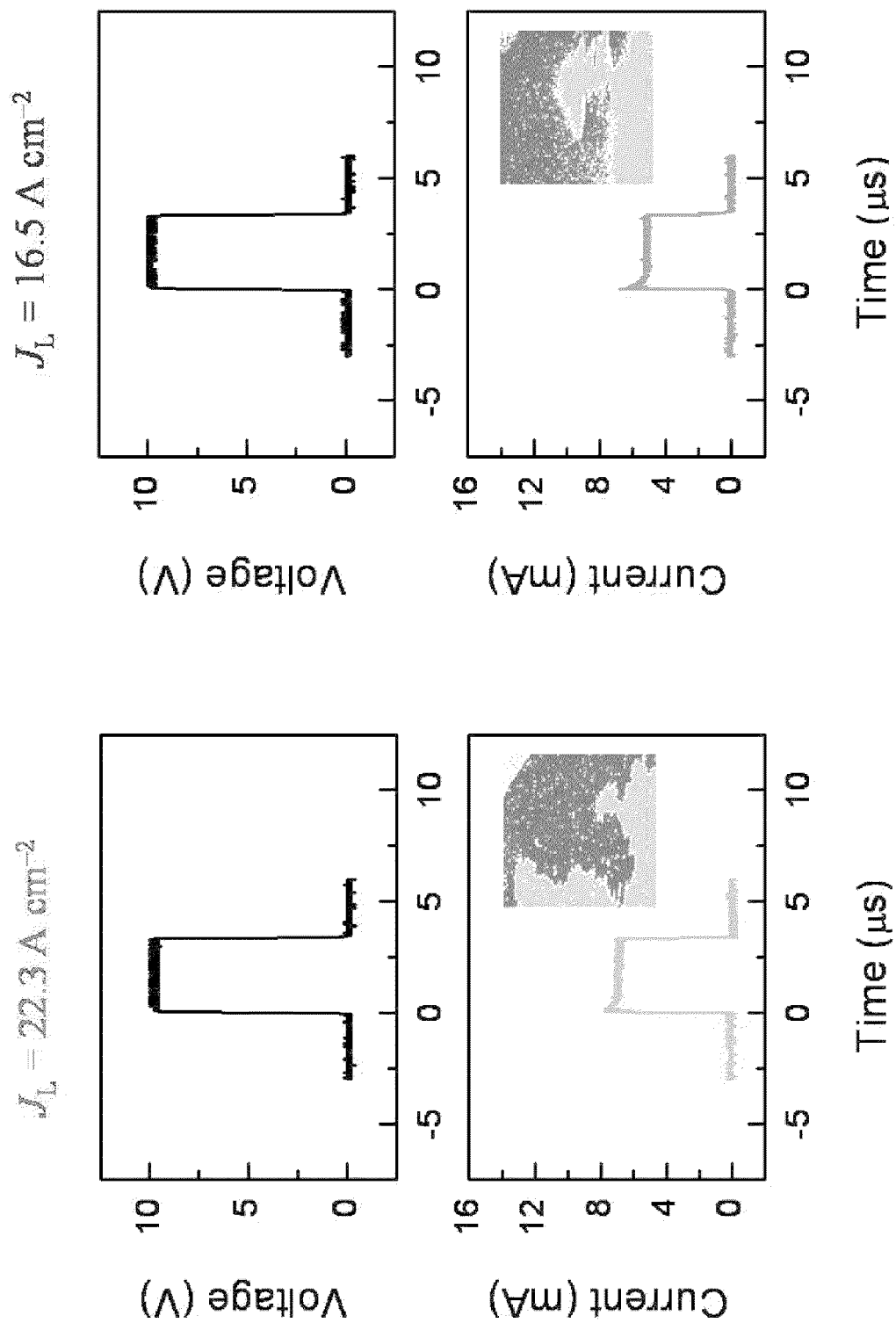
Figure 9C:
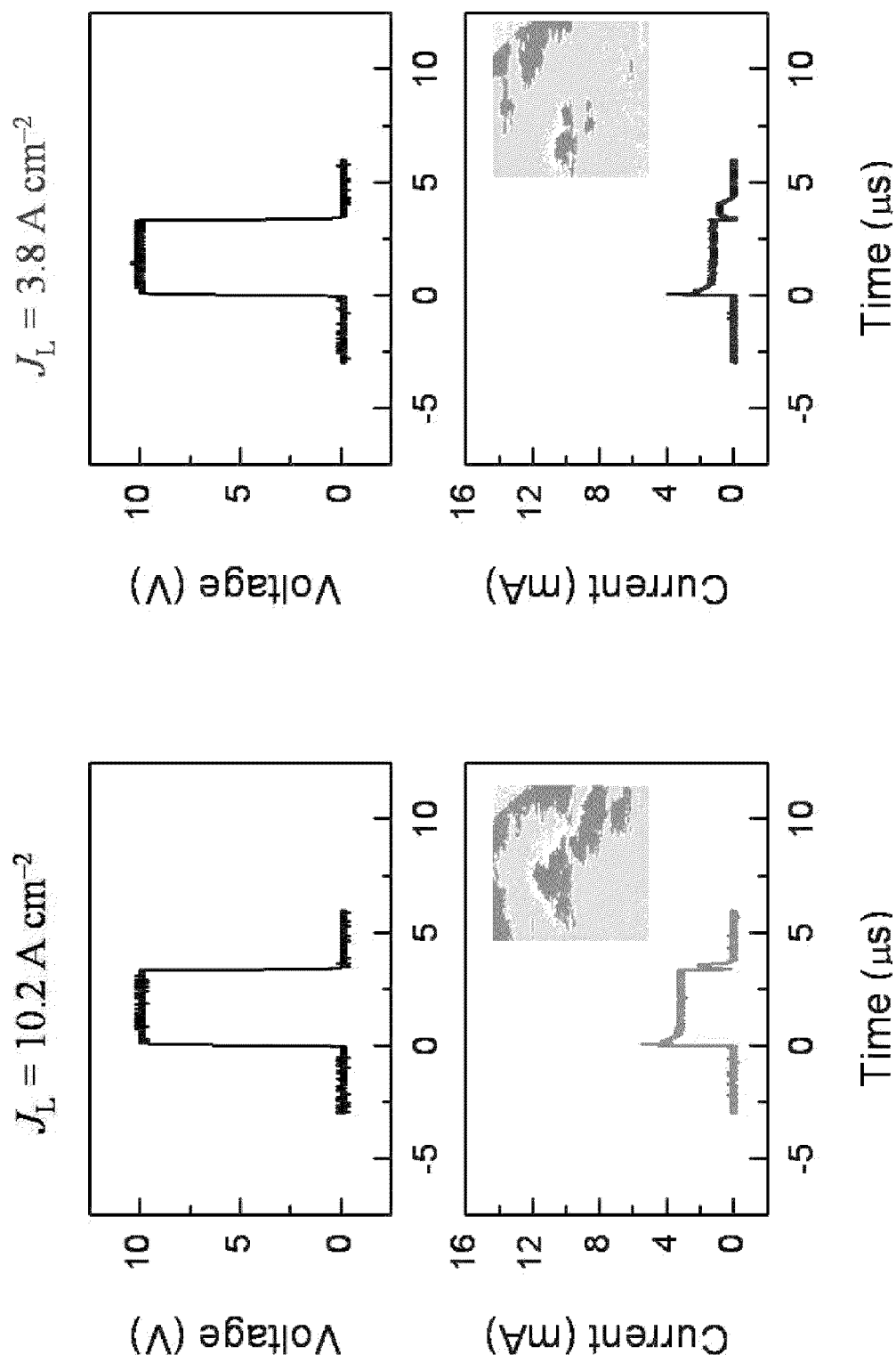

FIG. 9A to FIG. 9C shows +Ps or −Ps domain patterns and pulses of switched polarization in relation to current of the BFO ferroelectric thin film in accordance with the present example. FIG. 9A, FIG. 9B and FIG. 9C illustrate polarization domain arrays and graphs thereof of the ferroelectric capacitor in respective cases where there is no limit in $J_L$ (No limit) and $J_L$ is limited to 29.3 Acm$^{-2}$, 22.3 Acm$^{-2}$ and 16.5 Acm$^{-2}$, 10.2 Acm$^{-2}$ and 3.8 Acm$^{-2}$. While applying a voltage pulse of +10 V (~3.3 μs) to the BFO capacitor, an outflow amount of electric current was measured from $J_D$. Before applying the pulse, the ferroelectric capacitor was set to be a −Ps state at an initially. The $J_D$ data changes systematically as a function of $J_L$. Further, $\Delta P_{expect}$ can be simply estimated by $J_L * \tau$. FIG. 9A to FIG. 9C shows ferroelectric domain arrays of BOF, which are very different from those of PZT. As shown in FIG. 9A to FIG. 9C, actually switched polarization values $\Delta P$ were measured by a pulse-measured polarization hysteresis loop and PEM and found to be equivalent to the $\Delta P_{expect}$ values. As can be seen from FIG. 9A to FIG. 9C, although the domain array of the BFO ferroelectric capacitor is different from that of the PZT capacitor, polarization degrees achieved by limiting electric current are relatively clearly distinguishable. In this aspect, the multilevel polarization state for ferroelectric material by the displacement current control method of the present disclosure has universality. That is, the displacement current control method of the present disclosure may be applicable to other kinds of ferroelectric materials not mentioned in the present disclosure by those skilled in the art.

The above description of the illustrative embodiments is provided for the purpose of illustration, and it would be understood by those skilled in the art that various changes and modifications may be made without changing technical conception and essential features of the illustrative embodiments. Thus, it is clear that the above-described illustrative embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

Explanation Of Codes

110: Ground
120: Pulse generator
130: Ferroelectric capacitor
140: Transistor
142: Resistor
144: DC power supply
150: Current limiter

We claim:

1. A ferroelectric memory device, comprising:
a ferroelectric capacitor; and
a current limiter including a transistor which is electrically connected to the ferroelectric capacitor,
wherein the ferroelectric capacitor includes a multilevel polarization state during a polarization switching process of the ferroelectric capacitor,
wherein the current limiter includes a resistor and a DC power supplier connected to the transistor.

2. The ferroelectric memory device of claim 1,
wherein the multilevel polarization state is generated in the ferroelectric capacitor by controlling a displacement current which is inputted to and outputted from the ferroelectric capacitor during the polarization switching process of the ferroelectric capacitor, via adjusting an outflow current from the ferroelectric capacitor by means of the current limiter.

3. The ferroelectric memory device of claim 2,
wherein the multilevel polarization state having a desired polarization value is generated in the ferroelectric capacitor by adjusting a speed and an amount of the polarization switching by way of controlling the displacement current.

4. The ferroelectric memory device of claim 2,
wherein the ferroelectric capacitor includes a polarization domain array of +Ps to −Ps via controlling the displacement current.

5. The ferroelectric memory device of claim 2,
wherein the outflow current from the ferroelectric capacitor is adjusted by applying a DC bias voltage to a base of the transistor connected to the ferroelectric capacitor.

6. The ferroelectric memory device of claim 1,
wherein the ferroelectric capacitor includes a ferroelectric material inserted between a top electrode and a bottom electrode thereof.

7. The ferroelectric memory device of claim 6,
wherein the ferroelectric material includes a perovskite-based ferroelectric material.

8. The ferroelectric memory device of claim 7,
wherein the perovskite-based ferroelectric material includes a member selected from a group consisting of lead zirconium titanate, barium titanate, strontium titanate, lead titanate, lead lanthanum zirconate titanate, lanthanum bismuth titanate, bismuth iron oxide, strontium bismuth tantalite, and combinations thereof.

9. The ferroelectric memory device of claim 6,
wherein the ferroelectric material is in the form of an epitaxial thin film.

10. The ferroelectric memory device of any one of claim 1,2,3 to 9,
wherein the ferroelectric memory device includes FeRAM.

* * * * *